United States Patent
Katsumata et al.

(10) Patent No.: US 8,541,866 B2
(45) Date of Patent: Sep. 24, 2013

(54) NONVOLATILE SEMICONDUCTOR MEMORY DEVICE AND METHOD FOR MANUFACTURING SAME

(75) Inventors: Ryota Katsumata, Kanagawa-ken (JP); Masaru Kito, Kanagawa-ken (JP); Yoshiaki Fukuzumi, Kanagawa-ken (JP); Masaru Kidoh, Tokyo (JP); Hiroyasu Tanaka, Tokyo (JP); Yosuke Komori, Kanagawa-ken (JP); Megumi Ishiduki, Kanagawa-ken (JP); Hideaki Aochi, Kanagawa-ken (JP); Ryouhei Kirisawa, Kanagawa-ken (JP); Junya Matsunami, Kanagawa-ken (JP); Tomoko Fujiwara, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 790 days.

(21) Appl. No.: 12/722,920

(22) Filed: Mar. 12, 2010

(65) Prior Publication Data
US 2010/0244186 A1    Sep. 30, 2010

(30) Foreign Application Priority Data
Mar. 24, 2009    (JP) .................................. 2009-072486

(51) Int. Cl.
*H01L 29/00*    (2006.01)

(52) U.S. Cl.
USPC ............................ 257/530; 257/298; 257/314

(58) Field of Classification Search
USPC ................... 257/298, 314–326, 530
See application file for complete search history.

(56) References Cited

U.S. PATENT DOCUMENTS

| | | | |
|---|---|---|---|
| 6,525,403 B2 * | 2/2003 | Inaba et al. | 257/618 |
| 6,727,544 B2 | 4/2004 | Endoh et al. | |
| 6,870,215 B2 | 3/2005 | Endoh et al. | |
| 6,933,556 B2 | 8/2005 | Endoh et al. | |
| 2004/0041189 A1 * | 3/2004 | Voshell et al. | 257/297 |
| 2007/0252201 A1 | 11/2007 | Kito et al. | |

FOREIGN PATENT DOCUMENTS

JP    2007-266143    10/2007

* cited by examiner

*Primary Examiner* — Ori Nadav
(74) *Attorney, Agent, or Firm* — Oblon, Spivak, McClelland, Maier & Neustadt, L.L.P.

(57) ABSTRACT

A nonvolatile semiconductor memory device, includes: a stacked structural unit including a plurality of stacked component units stacked in a first direction, each of the stacked component units including a first conducting film made of a semiconductor of a first conductivity type provided perpendicular to the first direction and a first insulating film stacked in the first direction with the first conducting film; a semiconductor pillar piercing the stacked structural unit in the first direction and including a conducting region of a second conductivity type, the semiconductor pillar including a first region opposing each of the first conducting films, and a second region provided between the first regions with respect to the first direction, the second region having a resistance different from a resistance of the first region; and a second insulating film provided between the semiconductor pillar and the first conducting film.

18 Claims, 13 Drawing Sheets

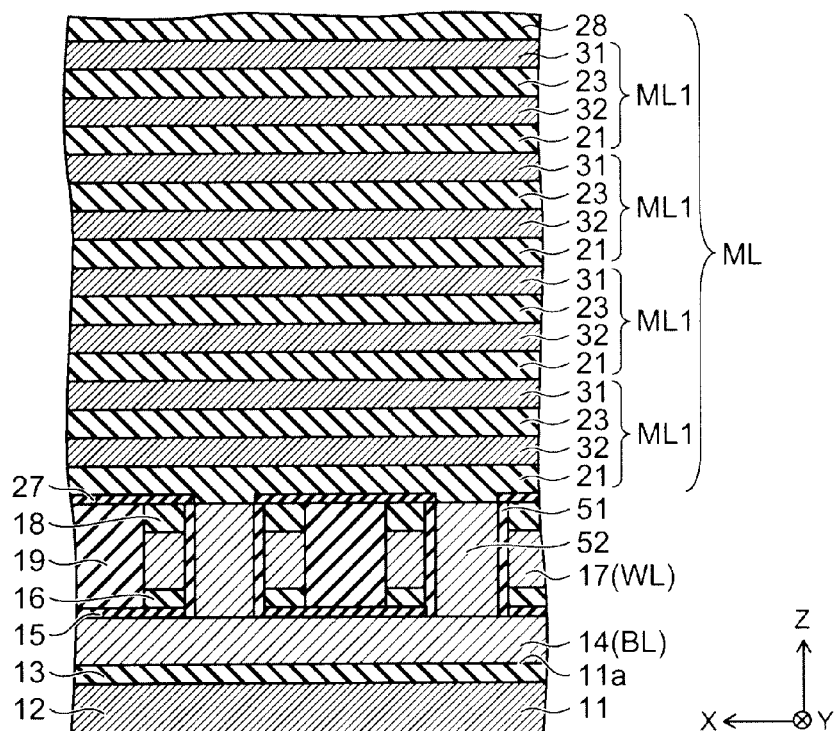
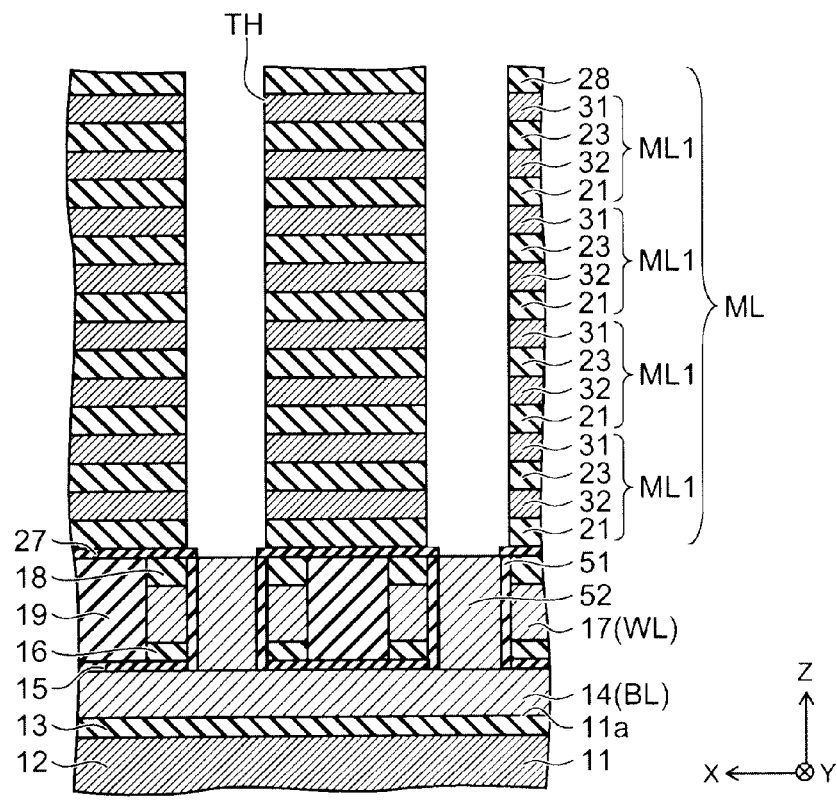

NONVOLATILE SEMICONDUCTOR MEMORY DEVICE AND METHOD FOR MANUFACTURING SAME

CROSS-REFERENCE TO RELATED APPLICATIONS

This application is based upon and claims the benefit of priority from the prior Japanese Patent Application No. 2009-072486, filed on Mar. 24, 2009; the entire contents of which are incorporated herein by reference.

BACKGROUND OF THE INVENTION

1. Field of the Invention

The invention relates to a nonvolatile semiconductor memory device and a method for manufacturing the same.

2. Background Art

High integration of devices by downscaling on two dimensional silicon substrate surfaces is reaching limitations. A major purpose of the high integration of semiconductor memory is to achieve large capacity by reducing the bit cost. Strategies include stacking transistors three dimensionally.

However, methods that simply pattern and stack one layer at a time lead to higher costs due to the increase in the number of processes necessary for the stacking. In particular, increasing the number of lithography processes for patterning the transistor structure is a main cause of higher costs, and the trend of higher costs is significant when increasing the number of layers. Therefore, reducing the silicon surface area per bit by stacking does not reduce the bit cost as much as downscaling on the silicon surface; and as a method to increase capacity, problems remain.

To solve such problems, the inventors have invented a nonvolatile semiconductor memory device having a collectively patterned stacked structure (for example, refer to JP-A 2007-266143 (Kokai)). One feature of the collectively patterned stacked structure is that the number of lithography processes necessary for patterning does not depend on the number of stacks. Therefore, in the case where the number of stacks of the collectively patterned stacked structure increases, the silicon surface area per bit is reduced, and it is possible to reduce the bit cost.

On the other hand, a one-time programmable memory (OTP memory) cannot perform the erasing of data or the rewriting of data and only reading is possible after once writing the data.

The collectively patterned stacked structure may be applied also to OTP memory. For example, the OTP memory may be formed by forming silicon pillars having circular columnar configurations to pierce multiply stacked electrode films and forming silicon oxide films at the intersection points between the multiple layers of electrode films and the silicon pillars.

In other words, for example, the silicon pillars may be an n-type semiconductor, the stacked electrode films may be a p-type semiconductor; and after destructing a silicon oxide film, PN junction diodes can be formed at the intersections between the silicon pillars and the electrode films.

In such a case, it is necessary to suppress the voltage drop of the silicon pillar forming the current path to each of the diodes. Conversely, in the case where high concentration doping of the silicon pillar is performed to reduce the resistance of the silicon pillar and high concentration doping of the electrode film is performed accordingly, the n-type and p-type semiconductors doped with high concentrations contact each other after the destruction of the silicon insulating film; a larger leak current occurs in the reverse direction; and signal detection is difficult. Conversely, in the case where the doping concentration of the silicon pillar is reduced, the region of the depletion layer occurring from the n-type semiconductor forming the electrode film enlarges; the leak current between the electrode films above and below increases; and as expected, the signal detection is difficult. Also, reducing the doping concentration of the silicon pillar undesirably causes the resistance of the silicon pillar to increase. Thus, in conventional PN diode structures, the voltage drop of the silicon pillar, the increase of the leak current in the reverse direction, the increase of the leak current between the electrode films above and below, or the increase of the resistance of the silicon pillar may occur; and there is room for improvement to obtain more stable operations.

SUMMARY OF THE INVENTION

According to an aspect of the invention, there is provided a nonvolatile semiconductor memory device, including: a stacked structural unit including a plurality of stacked component units stacked in a first direction, each of the stacked component units including a first conducting film made of a semiconductor of a first conductivity type provided perpendicular to the first direction and a first insulating film stacked in the first direction with the first conducting film; a semiconductor pillar piercing the stacked structural unit in the first direction and including a conducting region of a second conductivity type, the semiconductor pillar including a first region opposing each of the first conducting films, and a second region provided between the first regions with respect to the first direction, the second region having a resistance different from a resistance of the first region; and a second insulating film provided between the semiconductor pillar and the first conducting film.

According to another aspect of the invention, there is provided a method for manufacturing a nonvolatile semiconductor memory device, including: forming a stacked structural unit on a major surface of a substrate, the stacked structural unit including a plurality of stacked layers of stacked component units, the stacked component unit including a first conducting film made of a semiconductor of a first conductivity type, a first insulating film, a second conducting film made of a semiconductor of a second conductivity type, and a third insulating film, the forming of the stacked structural unit including multiply repeating a forming of the stacked component unit on a major surface of a substrate, the forming of the stacked component unit including stacking the first conducting film, stacking the first insulating film, stacking the second conducting film between the stacking of the first conducting film and the stacking of the first insulating film, and stacking the third insulating film between the stacking of the second conducting film and the stacking of the first conducting film; making a through-hole in a first direction perpendicular to the major surface to pierce the stacked structural unit; forming a second insulating film on an inner wall of the through-hole and filling a semiconductor material into a remaining space on the inner side of the through-hole to form a semiconductor pillar; and diffusing an impurity included in the second conducting film into the semiconductor pillar to form a region of the semiconductor pillar having a high impurity concentration alternately arranged in the first direction with a region of the semiconductor pillar having a low impurity concentration.

BRIEF DESCRIPTION OF THE DRAWINGS

FIGS. 7A and 7B are schematic cross-sectional views in order of the processes, illustrating a method for manufacturing a nonvolatile semiconductor memory device according to the first embodiment of the invention;

DETAILED DESCRIPTION OF THE INVENTION

Figure 1:
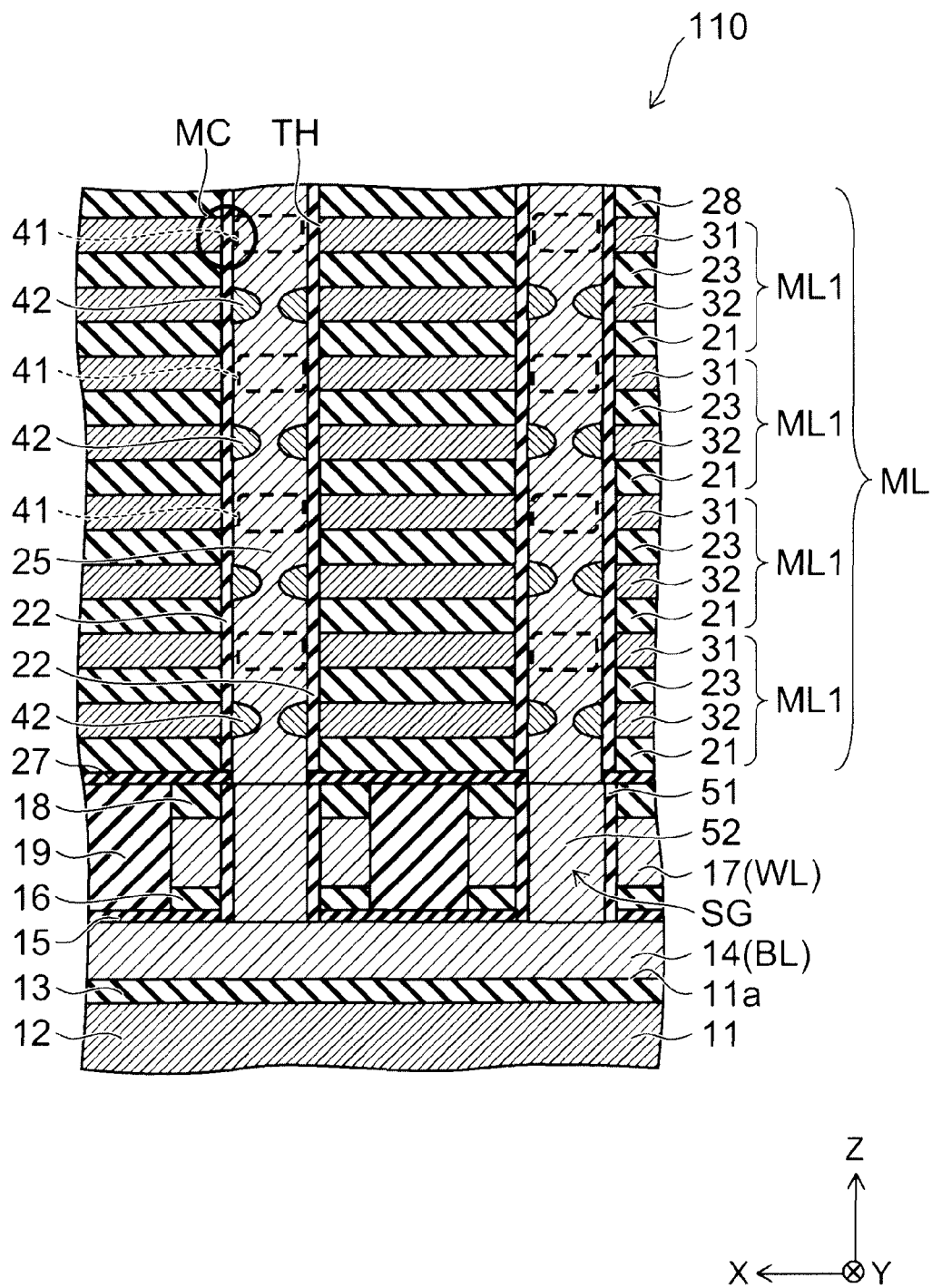
FIG. 1 is a schematic cross-sectional view illustrating the configuration of a nonvolatile semiconductor memory device according to a first embodiment of the invention.

Embodiments of the invention will now be described with reference to the drawings.

The drawings are schematic or conceptual; and the relationships between the thickness and width of portions, the proportional coefficients of sizes among portions, etc., are not necessarily the same as the actual values thereof. Further, the dimensions and proportional coefficients may be illustrated differently among drawings, even for identical portions.

In the specification of the application and the drawings, components similar to those described in regard to a drawing thereinabove are marked with like reference numerals, and a detailed description is omitted as appropriate.

First Embodiment

Figure 2:
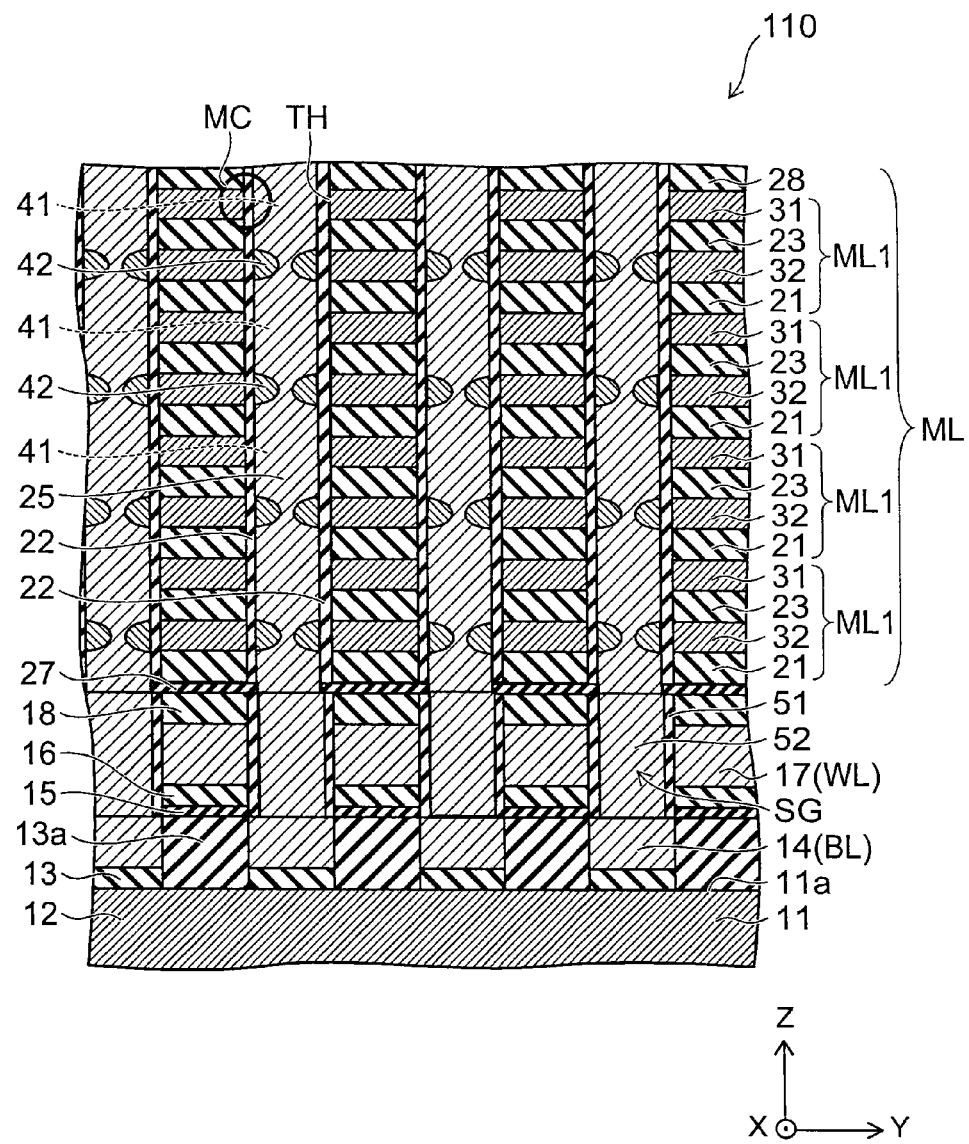
FIG. 2 is a schematic cross-sectional view illustrating the configuration of the nonvolatile semiconductor memory device according to the first embodiment of the invention.

FIG. 1 and FIG. 2 are schematic cross-sectional views illustrating the configuration of a nonvolatile semiconductor memory device according to a first embodiment of the invention.

Figure 3:
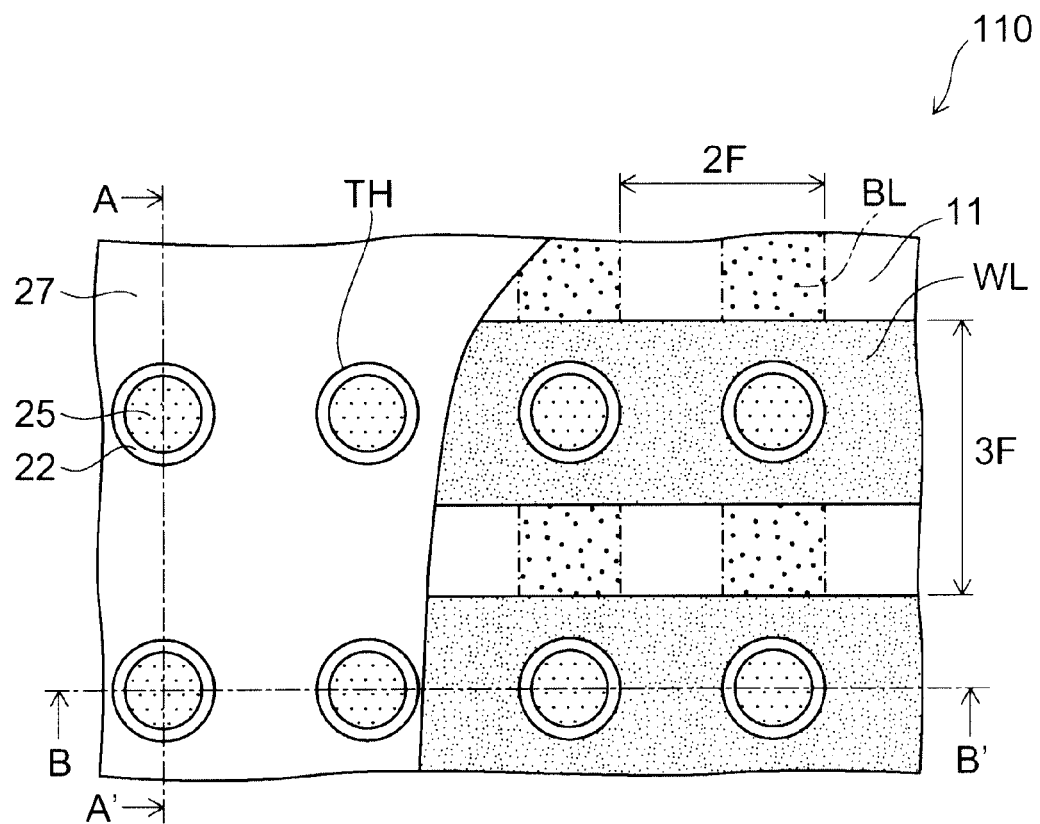
FIG. 3 is a schematic plan view illustrating the configuration of the nonvolatile semiconductor memory device according to the first embodiment of the invention.

FIG. 3 is a schematic plan view illustrating the configuration of the nonvolatile semiconductor memory device according to the first embodiment of the invention.

Figure 4:
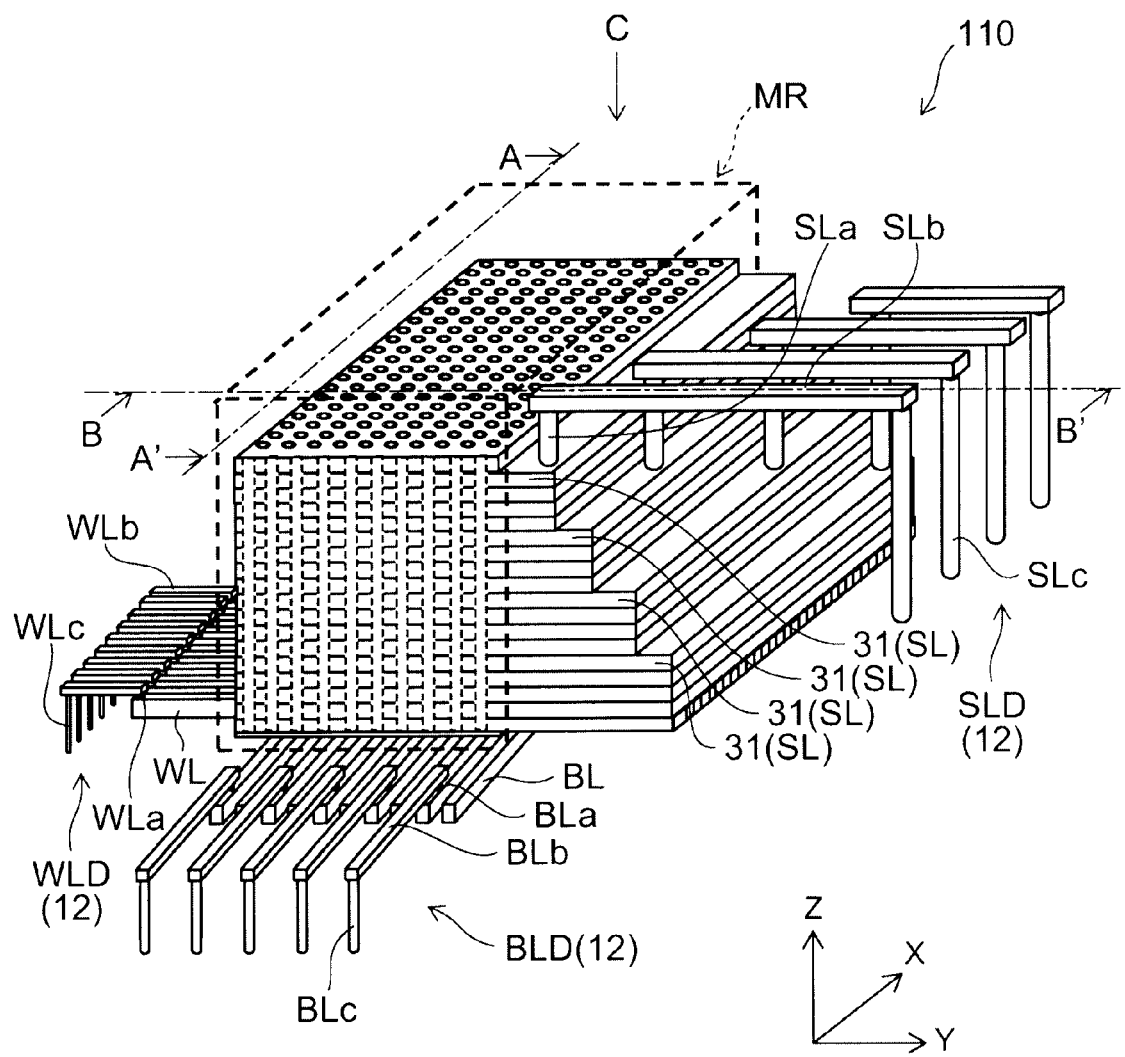
FIG. 4 is a schematic perspective view illustrating the configuration of the nonvolatile semiconductor memory device according to the first embodiment of the invention.

FIG. 4 is a schematic perspective view illustrating the configuration of the nonvolatile semiconductor memory device according to the first embodiment of the invention.

Figure 5:
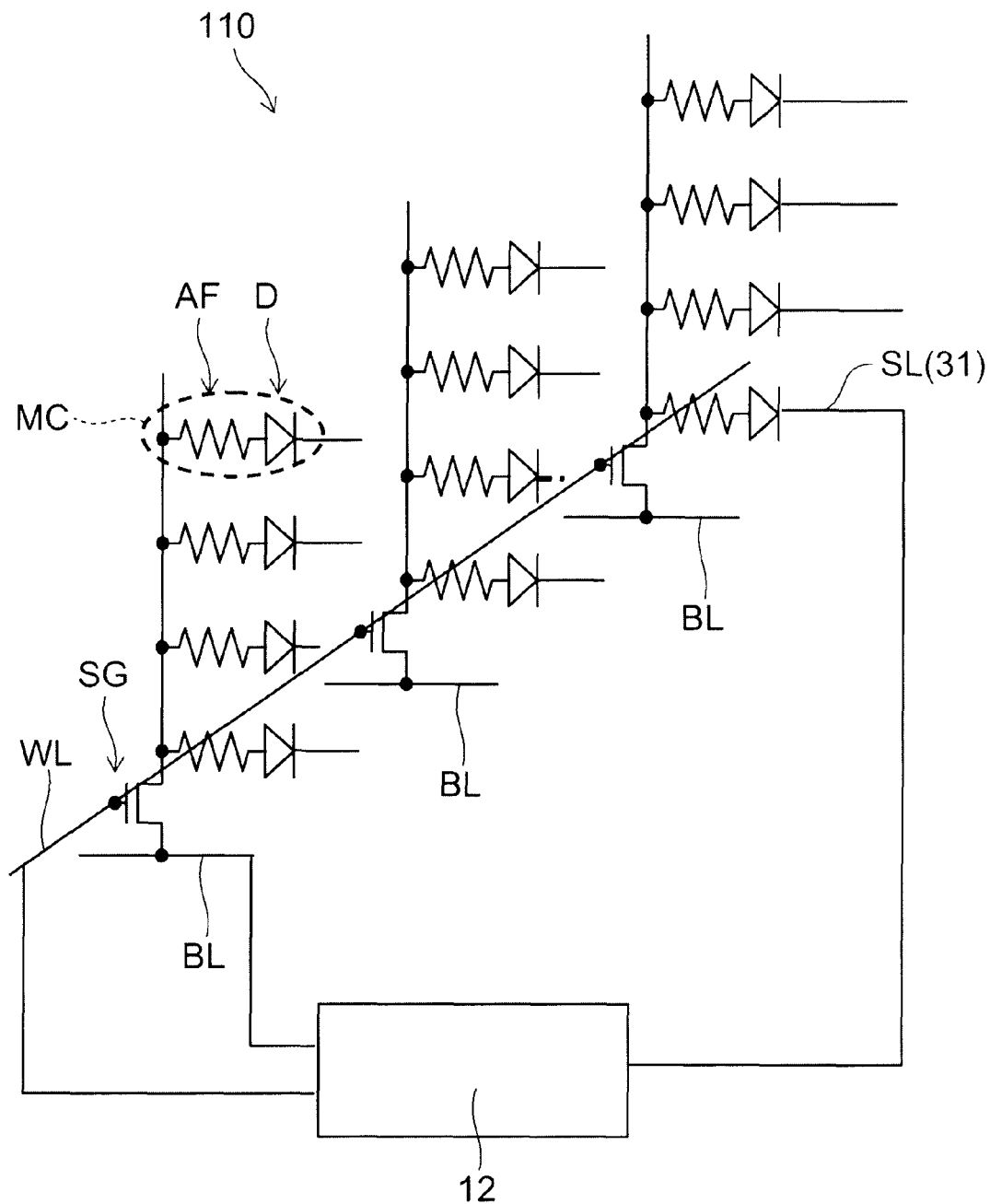
FIG. 5 is a schematic view illustrating operations of the nonvolatile semiconductor memory device according to the first embodiment of the invention.

FIG. 5 is a schematic view illustrating operations of the nonvolatile semiconductor memory device according to the first embodiment of the invention.

Namely, FIG. 1 is a cross-sectional view along line A-A' of FIG. 3 and FIG. 4. FIG. 2 is a cross-sectional view along line B-B' of FIG. 3 and FIG. 4. The portion on the left side of FIG. 3 is a plan view as viewed from the direction of the arrow C of FIG. 4. The portion on the right side of FIG. 3 is a perspective plan view in which insulating portions are omitted. For easier viewing of the drawing, FIG. 4 illustrates only conducting portions, and the insulating portions are omitted.

As illustrated in FIG. 1 to FIG. 4, a nonvolatile semiconductor memory device 110 according to the first embodiment of the invention includes a stacked structural unit ML. The stacked structural unit ML is provided on a major surface 11a of a semiconductor substrate 11 made of, for example, monocrystalline silicon.

The stacked structural unit ML includes multiple layers of a stacked component unit ML1 described below. In other words, in the stacked structural unit ML, multiple layers of the stacked component unit ML1 are stacked in a direction perpendicular to the major surface 11a.

An XYZ orthogonal coordinate system will now be introduced for convenience of description in the specification of the application. In this coordinate system, a direction perpendicular to the major surface 11a of the semiconductor substrate 11 is taken as a Z-axis direction (first direction). One direction in a plane parallel to the major surface 11a is taken as an X-axis direction (second direction). A direction perpendicular to the Z axis and the X axis is taken as a Y-axis direction (third direction).

The stacking direction of the stacked component units ML1 in the stacked structural unit ML is the Z-axis direction.

As illustrated in FIG. 1 and FIG. 2, each of the stacked component units ML1 includes a first conducting film 31 and a first insulating film 21 stacked in the Z-axis direction. In the stacked component unit ML1, the vertical relationship of the first conducting film 31 and the first insulating film 21 in the Z-axis direction is arbitrary. Hereinbelow, the case is described where the first insulating film 21 is disposed on the semiconductor substrate 11 side and the first conducting film 31 is disposed on the upper side of the first insulating film 21.

In other words, the stacked structural unit ML has a structure in which the first conducting film 31 is provided parallel to the major surface 11a and alternately stacked with the first insulating film 21.

The first conducting film 31 is made of a semiconductor of a first conductivity type. Polysilicon, for example, may be used as the first conducting film 31. The first conductivity type may be either an n-type or a p-type. Hereinbelow, to simplify the description, the first conducting film 31 is taken to be the n-type.

The nonvolatile semiconductor memory device 110 further includes a semiconductor pillar 25 piercing the stacked structural unit ML in the Z-axis direction and a second insulating film 22 provided between the semiconductor pillar 25 and the first conducting film 31.

The nonvolatile semiconductor memory device 110 may further include a drive circuit 12 to apply a potential to the first conducting film 31 and the semiconductor pillar 25.

The semiconductor pillar 25 has a region of a second conductivity type. In the case where the first conducting film has the first conductivity type, i.e., the n-type, the semiconductor pillar 25 has a region of the second conductivity type, i.e., the p-type. In this specific example, the region of the p-type is a second region 42 described below.

Although the region of the second conductivity type is partially provided in the semiconductor pillar 25 in this specific example, the entire semiconductor pillar 25 may have the second conductivity type as in a second embodiment described below.

Various types of silicon such as amorphous silicon and polysilicon, for example, may be used as the semiconductor pillar 25. However, the invention is not limited thereto. Any semiconductor material may be used as the semiconductor pillar 25.

A silicon oxide film and the like, for example, may be used as the second insulating film 22. However, the invention is not limited thereto. Any insulating material may be used as the second insulating film 22.

The semiconductor pillar 25 and the second insulating film 22 may be formed by, for example, making a through-hole TH to pierce the stacked structural unit ML in the Z-axis direction; depositing, for example, a silicon oxide film forming the second insulating film 22 on the side wall of the inner side of the through-hole TH; and subsequently filling, for example, silicon into the remaining space in the through-hole TH.

The semiconductor pillar 25 includes a first region 41 alternately provided in the Z-axis direction with a second region 42. The first region 41 is provided at each portion of the semiconductor pillar 25 opposing the first conducting films 31. The second region 42 is provided in the semiconductor pillar 25 between the first regions 41 with respect to the Z-axis direction.

The second region 42 has a resistance different from that of the first region 41. As described below, in this specific example, the resistance of the second region 42 is lower than that of the first region 41.

In the nonvolatile semiconductor memory device 110 having such a configuration, memory cells MC are formed at the portions where the semiconductor pillar 25 and the first conducting films 31 intersect.

In this specific example, an inter-layer insulating film 27 is provided on the semiconductor substrate 11 side of the stacked component unit ML1 most proximal to the semiconductor substrate 11 in the stacked structural unit ML; and an inter-layer insulating film 28 is provided on the side opposite to the semiconductor substrate 11 of the stacked component unit ML1 most distal to the semiconductor substrate 11 in the stacked structural unit ML. Here, the inter-layer insulating films 27 and 28 are taken to be included in the stacked structural unit ML. However, the inter-layer insulating films 27 and 28 may be considered to be entities separate from the stacked structural unit ML.

In this specific example, a bit line BL and a word line WL are provided between the stacked structural unit ML and the semiconductor substrate 11. In other words, the nonvolatile semiconductor memory device 110 further includes a semiconductor layer 52 electrically connected to the semiconductor pillar 25, the bit line BL (a first interconnect 14) provided to oppose the semiconductor layer 52 and align in the X-axis direction, the word line WL (a second interconnect 17) aligned in the Y-axis direction, and a gate insulating film (a fifth insulating film 51) provided between the semiconductor layer 52 and the word line WL.

A vertical transistor having the semiconductor layer 52 as a channel is formed at each of the intersections of the semiconductor pillars 25 and the word line WL. The fifth insulating film 51 forms the gate insulating film of the vertical transistor. The vertical transistor functions as a selection gate transistor SG to select the semiconductor pillar 25.

Although the word line WL is taken to align in the Y-axis direction orthogonal to the Z axis and the X axis to simplify the description above, it is sufficient that the word line WL is aligned in a direction perpendicular to the Z axis and non-parallel to the X axis.

Thus, the bit line BL and the word line WL are provided to three dimensionally intersect each other; inter-layer insulating films 15 and 16 are provided therebetween; and inter-layer insulating films 18 and 19 are provided between the word lines WL and provided between the word line WL and the stacked structural unit ML. An inter-layer insulating film 13a is provided between the semiconductor substrate 11 and the bit line BL.

As illustrated in FIG. 3, the disposition pitch of the word lines WL may be 3F, where F is the minimum patterning dimension of the nonvolatile semiconductor memory device 110. For example, the word line width may be 2F, and the spacing between the word lines WL may be F. On the other hand, the disposition pitch of the bit lines BL may be 2F. For example, the bit line width may be F, and the spacing between the bit lines BL may be F.

The semiconductor pillars 25 are arranged in a matrix configuration in the X-Y plane at each of the positions corresponding to the intersection points between the word lines WL and the bit lines BL having such a configuration. In such a case, the diameter of the through-hole TH for forming the semiconductor pillar 25 may be F. Accordingly, the diameter of the semiconductor pillar 25 is smaller than the diameter of the through-hole TH by an amount of twice the thickness of the second insulating film 22.

As illustrated in FIG. 4, the region in which the semiconductor pillars 25 are arranged in the matrix configuration is a three dimensional memory region MR. Each of the first conducting films 31 function as a source line SL. Each of the first conducting films 31 is connected to a source line driver SLD (not illustrated) via, for example, a through-electrode SLa, an interconnect SLb, and a through-electrode SLc.

Each of the bit lines BL are connected to a bit line driver BLD (not illustrated) via, for example, a through-electrode BLa, an interconnect BLb, and a through-electrode BLc. Each of the word lines WL is connected to a word line driver WLD (not illustrated) via, for example, a through-electrode WLa, an interconnect WLb, and a through-electrode WLc.

In the nonvolatile semiconductor memory device 110, a prescribed potential is applied to the first conducting film 31 and the semiconductor pillar 25 by the source line driver SLD, the bit line driver BLD, and the word line driver WLD. In other words, the drive circuit 12 includes at least one selected from the source line driver SLD, the bit line driver BLD, and the word line driver WLD. At least one selected from the source line driver SLD, the bit line driver BLD, and the word line driver WLD may be provided on the semiconductor substrate 11.

In the nonvolatile semiconductor memory device 110 as illustrated in FIG. 5, the selection gate transistor SG is provided in a lower layer of the stacked structural unit ML; and the word line WL forms the gate electrode of the selection gate transistor SG. One side of the semiconductor layer 52 of the selection gate transistor SG is connected to the semiconductor pillar 25 of the memory cells MC formed in the stacked structural unit ML; and the other side is connected to the bit line BL. The word line WL and the bit line BL are connected to the word line driver WLD (not illustrated) and the bit line driver BLD (not illustrated), respectively, of the drive circuit 12.

Each of the memory cells MC includes an antifuse AF and a diode D. The second insulating film 22 forms the antifuse AF. The semiconductor pillar 25 and the first conducting film 31 form the diode D. The first conducting film 31 forms the source line SL and is connected to the source line driver SLD (not illustrated) of the drive circuit 12.

In other words, the second insulating film 22 is selectively destructed to function as the antifuse AF by passing an excessive current through the second insulating film 22 (e.g., a silicon oxide film) between the first conducting film 31, i.e., the prescribed source line SL, and the prescribed semiconductor pillar 25 via the first conducting film 31 and the semiconductor pillar 25. Data of "1" and "0" is stored by the change of the resistance of the second insulating film 22. Corresponding to data of "1" and "0," the case where the second insulating film 22 is destructed corresponds to a low resistance state, and the case where the second insulating film 22 is not destructed corresponds to a high resistance state, respectively. Data is written by selectively destructing the second insulating film 22. Once destructed, the second insulating film 22 cannot be restored, and the nonvolatile semiconductor memory device 110 is utilized as an OTP memory capable of being written to only once.

The nonvolatile semiconductor memory device 110 may perform operations such as those recited below.

First, the potential of the bit line BL connected to the bit to be read is set to a high level VhB, and the unselected bit lines BL are fixed at a low level VlB voltage. Then, the potential of the source line SL (the first conducting film 31) corresponding to the layer of the bit to be read is set to a low level VlS, and the unselected source lines SL are set to a high level VhS. Then, the selection gate transistor SG corresponding to the bit to be read is switched to the ON state.

By the potential relationship recited above, a forward bias is applied only to the diode D corresponding to the bit to be read. In the diodes D not connected to the bit to be read, current does not flow due to being in a state in which a reverse bias is applied or in a state in which the same potentials are applied, or a leak current flows due to a reverse bias.

When the sum total of the leak current is less than the current flowing in the bit to be read, the bit to be read is discriminated to be in the low resistance state. Conversely, when the sum total of the leak current is greater than the current flowing in the bit to be read, the bit to be read is discriminated to be in the high resistance state.

Thereby, the nonvolatile semiconductor memory device 110 operates as an OTP memory.

In an actual circuit, it is necessary also to consider the case where shifting occurring between the low levels of the bit line BL and the source line SL results in a slight forward bias state. Accordingly, in the example illustrated in FIG. 5, the low level VlS of the source line SL may be set to a potential slightly higher than the low level VlB of the bit line BL. For the same reason, the high level VhS of the source line SL may be set to a potential slightly higher than the high level VhB of the bit line BL.

As described above, the resistance of the second region 42 of the semiconductor pillar 25 is different from that of the first region 41. In other words, in this specific example, the first region 41 of the semiconductor pillar 25 opposing the first conducting film 31 is an intrinsic semiconductor. The second region 42 of the semiconductor pillar 25 alternately provided in the Z-axis direction with the first region 41 is a conducting region of the second conductivity type. The resistance of the second region 42 is lower than that of the first region 41.

In other words, a first concentration C1 of an impurity included in the first region 41 is lower than a second concentration C2 of an impurity included in the second region 42. In some cases, the first region 41 may include substantially no impurities; and in some cases, the first concentration C1 may substantially be zero.

For example, in the case where the first conducting film 31 includes a first impurity (e.g., As) with a third concentration C3, the second concentration C2 of the impurity included in the second region 42 may be set lower than the third concentration C3.

Thereby, an $n^+/i/p^-$ PIN diode, for example, is formed among the first conducting film 31, the first region 41, and the second region 42.

The first region 41 and the second region 42 have, for example, configurations such as those recited below.

In this specific example, an n-type (the first conductivity type) semiconductor may be used as the first conducting film 31. For example, an $n^+$-Si film containing As (arsenic) as the first impurity with a high concentration, i.e., the third concentration C3, may be used as the first conducting film 31.

Each of the stacked component units ML1 further includes a second conducting film 32 provided between the first conducting film 31 and the first insulating film 21 and includes a third insulating film 23 provided between the second conducting film 32 and the first conducting film 31. In the stacked structural unit ML including the stacked component units ML1, the second conducting film 32 is disposed between each pair of the first conducting films 31; and the first insulating film 21 or the third insulating film 23 is disposed between the second conducting film 32 and one of the first conducting films 31. The vertical relationship of the first conducting film 31 and the second conducting film 32 in the Z-axis direction is arbitrary.

A p-type (second conductivity type) semiconductor may be used as the second conducting film 32. In this specific example, a $p^+$-Si film containing B (boron) as a second impurity with a high concentration, i.e., a fourth concentration C4, may be used as the second conducting film 32.

An intrinsic semiconductor may be used as the semiconductor pillar 25. In other words, in this specific example, i-Si may be used as the semiconductor pillar 25.

In this specific example, the first region 41 is a portion of the semiconductor pillar 25 opposing the first conducting film 31; and the second region 42 is a portion of the semiconductor pillar 25 opposing the second conducting film 32. Thus, by providing the first conducting film 31 alternately in the Z-axis direction with the second conducting film 32, the second region 42 is provided in the semiconductor pillar 25 between the first regions 41 with respect to the Z-axis direction.

In the nonvolatile semiconductor memory device 110 having such a configuration, the B (the second impurity) doped into the second conducting film 32 passes through the second insulating film 22 and is diffused into the semiconductor pillar 25 by, for example, heat treatment at 1050° C. for 30 seconds. Therefore, B (the second impurity) is introduced into the second region 42 opposing the second conducting film 32, and the second region 42 forms a conducting region of the second conductivity type. In other words, the second region 42 becomes $p^-$ Si.

At this time, the second concentration C2 of the second impurity of the second region 42 is lower than the fourth concentration C4 of the second conducting film 32. The second concentration C2 of the second impurity of the second region 42 is lower than the third concentration C3 of the first conducting film 31.

In the semiconductor pillar 25, a region (the second region 42) having a high concentration of B, i.e., a p-type impurity, is alternately stacked in the Z-axis direction with a region (the first region 41) having a low concentration of B.

The region where B diffuses from the second conducting film 32 is limited to the second region 42, and B substantially does not diffuse into, for example, the first region 41. Accordingly, the first region 41 is i-Si. The As doped into the first conducting film 31 is blocked by the silicon oxide film, i.e., the second insulating film 22, and therefore substantially does not diffuse into the semiconductor pillar 25.

Thereby, after the second insulating film 22 is destructed in the nonvolatile semiconductor memory device 110, an $n^+/i/p^-$ PIN diode is formed of the first conducting film 31 functioning as the source line SL, the first region 41 of the semiconductor pillar 25, and the second region 42 of the semiconductor pillar 25. The second region 42 of such a PIN diode can suppress leak current between the adjacent first conducting films 31, i.e., the source lines SL, while ensuring the diode characteristics as an OTP memory.

Thereby, a nonvolatile semiconductor memory device can be provided as a collectively patterned stacked OTP memory having stable operations by using a diode with a high ON/OFF ratio.

First Comparative Example

Figure 6:
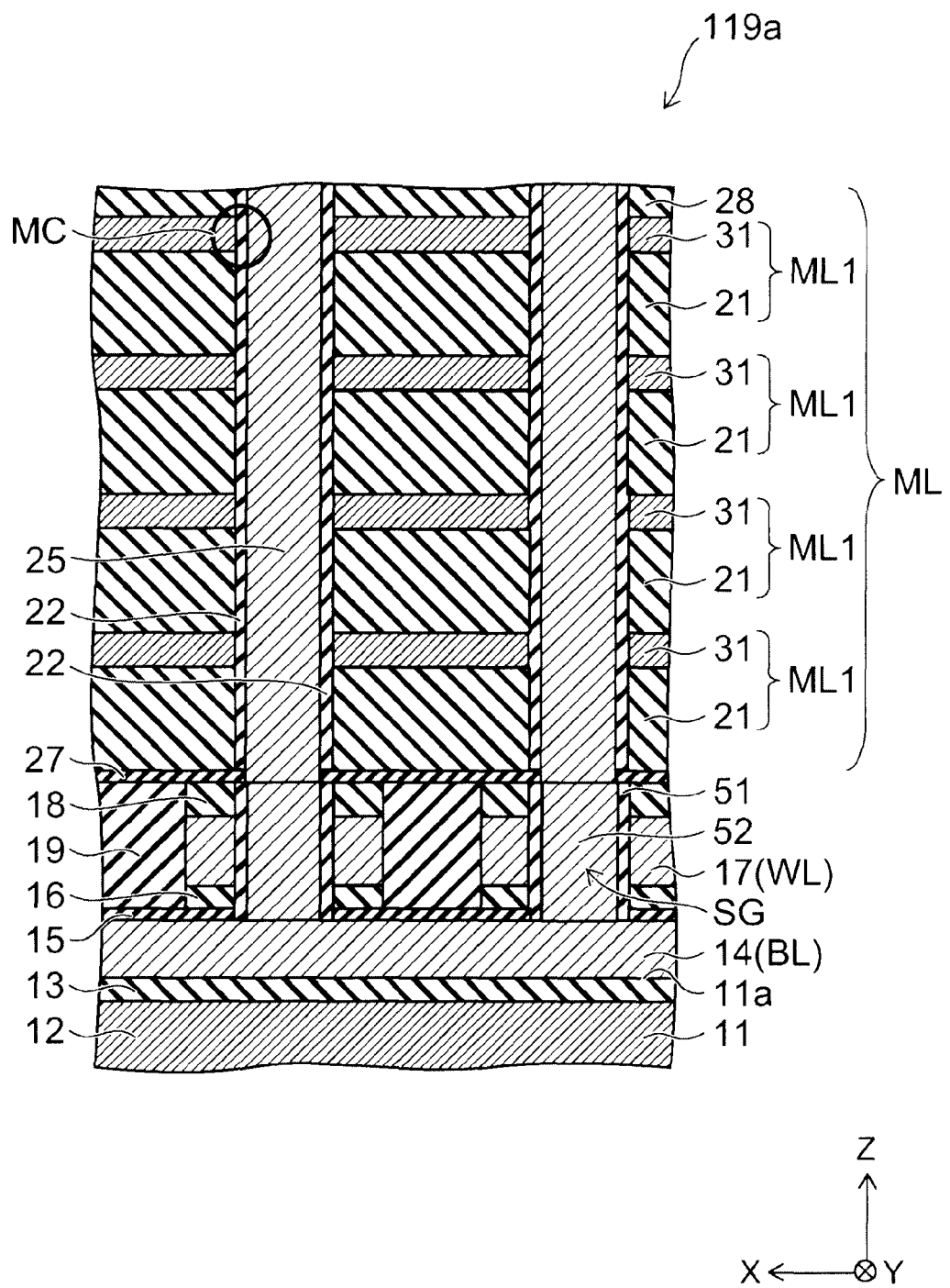
FIG. 6 is a schematic cross-sectional view illustrating the configuration of a nonvolatile semiconductor memory device of a comparative example.

FIG. 6 is a schematic cross-sectional view illustrating the configuration of a nonvolatile semiconductor memory device of a comparative example.

The planar structure of a nonvolatile semiconductor memory device 119a of the first comparative example is similar to that of the nonvolatile semiconductor memory device 110. Therefore, the portions of the nonvolatile semiconductor memory device 119a differing from those of the nonvolatile semiconductor memory device 110 will now be described.

FIG. 6 is a drawing corresponding to the cross section of the nonvolatile semiconductor memory device 110 along line A-A' of FIG. 3.

In the nonvolatile semiconductor memory device 119a as illustrated in FIG. 6, the semiconductor pillar 25 is a uniform layer, and the first region 41 and the second region 42 are not provided.

In other words, the stacked component unit ML1 of the stacked structural unit ML of the nonvolatile semiconductor memory device 119a includes only the first conducting film 31 stacked in the Z-axis direction with the first insulating film 21 and does not include the second conducting film 32 and the third insulating film 23.

For example, $n^+$-Si may be used as the first conducting film 31; and $p^+$-Si, for example, may be used as the semiconductor pillar 25. Silicon oxide films may be used as the first insulating film 21 and the second insulating film 22 similarly to the nonvolatile semiconductor memory device 110.

After the silicon oxide film, i.e., the second insulating film 22, is destructed in such a nonvolatile semiconductor memory device 119a, a diode made of a PN junction between the first conducting film 31 and the semiconductor pillar 25 is formed. The memory cell MC is formed at the intersection between the first conducting film 31 and the semiconductor pillar 25. By using the memory cell MC, the nonvolatile semiconductor memory device 119a may be utilized as an OTP memory.

The semiconductor pillar 25 forms the current path to each of the memory cells MC. It is conceivable to perform measures to reduce the resistance of the semiconductor pillar 25 by doping the semiconductor pillar 25 with, for example, a high concentration p-type impurity to suppress the voltage drop in the current path. At this time, the first conducting film 31 also is doped accordingly with a high concentration n-type impurity. Therefore, after the destruction of the second insulating film 22, the n-type and p-type semiconductors doped with high concentrations contact each other; the leak current in the reverse direction increases; and signal detection is difficult.

Conversely, in the case where, for example, the doping concentration of the p-type impurity of the semiconductor pillar 25 is reduced, the region of the depletion layer occurring from the n-type semiconductor forming the first conducting film 31 enlarges; the leak current between the first conducting films 31 above and below increases; and as expected, the signal detection is difficult. In the case where, for example, the doping concentration of the p-type impurity of the semiconductor pillar 25 is reduced further, the voltage drop of the current path to the memory cell MC increases; the voltage applied to the memory cell MC undesirably changes in the Z-axis direction; and operations become unstable.

Thus, in the PN diode structure as in the nonvolatile semiconductor memory device 119a of the comparative example, a voltage drop of the semiconductor pillar 25, an increase of leak current in the reverse direction, or an increase of leak current between the first conducting films 31 above and below occurs, and it is difficult to provide stable operations.

In such a case, it is conceivable to perform measures of making the film thickness of the first insulating film 21 thicker and increasing the spacing between the first conducting films 31 to suppress the increase of the leak current between the first conducting films 31 above and below. However, in such a case, the length of the semiconductor pillar 25 increases in the Z-axis direction, and as a result, causes a larger voltage drop in the semiconductor pillar 25.

Second Comparative Example

A nonvolatile semiconductor memory device 119b (not illustrated) of a second comparative example differs from the nonvolatile semiconductor memory device 119a as follows.

Namely, in the nonvolatile semiconductor memory device 119b, a metal material, for example, having a high work function such as Pt or Ru is used as the first conducting film 31. An n-type semiconductor, for example, is used as the semiconductor pillar 25. A silicon oxide film, for example, is used as the first insulating film 21. An oxide of the metal material of the first conducting film 31 may be used as the second insulating film 22. In such a case, the second insulating film 22 is not continuously provided around the semiconductor pillar 25 in the Z-axis direction, but is provided only at the portions where the first conducting films 31 intersect with the semiconductor pillars 25.

After the destruction of the second insulating film 22 in the nonvolatile semiconductor memory device 119b having such a structure, a Schottky junction diode is formed at the portion where the first conducting film 31 intersects with the semiconductor pillar 25.

It is difficult to ensure a high ON/OFF ratio in a Schottky junction diode. Therefore, it is difficult to discriminate between leak current of the diodes to which a reverse direction voltage is applied and the forward direction current of the selected diode; and it is difficult to increase the number of diodes, that is, the number of memory cells MC, connected to one bit line BL and one word line WL.

On the other hand, in the nonvolatile semiconductor memory device 110 according to this embodiment, the second conducting film 32 having a conductivity type different from the conductivity type of the first conducting film 31 is interposed between the first conducting films 31. Thereby, in the semiconductor pillar 25, the second region 42, i.e., the low concentration p-type semiconductor ($p^-$-Si), is alternately formed with the first region 41, which substantially does not contain an impurity (i-Si). Therefore, the voltage drop in the semiconductor pillar 25 is suppressed, and simultaneously, the leak current between the first conducting films 31 is reduced by the second region 42.

The leak current can be reduced because the PIN diode is used in which the intrinsic semiconductor is interposed between the p-type semiconductor and the n-type semiconductor. Such a PIN diode has a smaller leak current than that of a Schottky junction diode.

In other words, in the nonvolatile semiconductor memory device 110, the number of diodes, that is, the number of memory cells MC, connected to one bit line BL and one word line WL can be increased by using the PIN diode having a high ON/OFF ratio as the memory cell MC.

Thus, the nonvolatile semiconductor memory device 110 can be provided as a collectively patterned stacked OTP memory having stable operations in which interference between the source lines SL above and below is suppressed while using a PIN diode having a high ON/OFF ratio.

Although the second insulating film 22 in the nonvolatile semiconductor memory device 110 is provided to align not only between the semiconductor pillar 25 and the first conducting films 31 but also between the semiconductor pillar 25 and each of the second conducting films 32, the first insulating films 21, and the third insulating films 23, the invention is not limited thereto.

For example, the second insulating film 22 may be provided to align between the semiconductor pillar 25 and the first conducting films 31 and between the semiconductor pillar 25 and the second conducting films 32 but not between the semiconductor pillar 25 and each of the first insulating films 21 and the third insulating films 23.

In other words, in the nonvolatile semiconductor memory device 110, the second region 42 of the semiconductor pillar 25 is formed by diffusing an impurity from the second conducting film 32 via the second insulating film 22; and in some cases, it is not necessary to provide the second insulating film 22 between the semiconductor pillar 25 and each of the first insulating films 21 and the third insulating films 23.

Further, it is sufficient that the second region 42 of the second conductivity type is formed in the semiconductor pillar 25, and it is sufficient that the second insulating film 22 is provided between the semiconductor pillar 25 and the first insulating films 21.

The specific example recited above has a structure in which the first impurity included in the first conducting film 31 is As, the second impurity included in the second conducting film 32 is B, and the second region 42 includes B, i.e., the second impurity, diffused from the second conducting film 32 into the semiconductor pillar 25 via the second insulating film 22. The diffusion is performed by heat treatment. In other words, the second region 42 is formed by selectively diffusing only the second impurity included in the second conducting film 32 into the semiconductor pillar 25 by utilizing the properties that B easily passes through the silicon oxide film and As is blocked by the silicon oxide film.

Thus, the first impurity or the second impurity can be selectively introduced from the first conducting film 31 or the second conducting film 32 into the semiconductor pillar 25 by providing the second insulating film 22 with a permeability with respect to the second impurity different from the permeability with respect to the first impurity.

Specifically, for example, the permeability of the second insulating film 22 with respect to the second impurity may be set lower than the permeability with respect to the first impurity.

Thereby, the first region 41 and the second region 42 can be efficiently formed in the semiconductor pillar 25.

However, the invention is not limited thereto. Any method may be used to form the first region 41 and the second region 42.

For example, the second impurity (e.g., B) may be introduced from the second conducting film 32 into the semiconductor pillar 25 by applying a prescribed potential to the second conducting film 32, creating a potential difference between the second conducting film 32 and the semiconductor pillar 25, causing dielectric breakdown of the portion of the second insulating film 22 opposing the second conducting film 32 by the potential difference, and introducing the second impurity via the destructed portion.

Thus, the second region 42 can include the second impurity diffused from the second conducting film 32 into the semiconductor pillar 25 via the destructed portion selectively made in the second insulating film 22.

In other words, the second region 42 includes the second impurity diffused from the second conducting film 32. Thereby, it is possible to make the second concentration C2 (the concentration of the second impurity in the second region 42) lower than the fourth concentration C4 (the concentration of the second impurity in the second conducting film 32) relatively simply and with good controllability. Also, it is possible to make the second concentration C2 lower than the third concentration C3 (the concentration of the first impurity in the first conducting film 31) relatively simply and with good controllability.

Although the first conductivity type is the n-type and the second conductivity type is the p-type in the example described above, the invention is not limited thereto. In other words, the first conductivity type may be the p-type and the second conductivity type may be the n-type. In such a case, B, for example, may be doped as the first impurity into the first conducting film 31; and As, for example, may be doped as the second impurity into the second conducting film 32.

In such a case, the As doped into the second conducting film 32 is blocked by the silicon oxide film of the second insulating film 22. Therefore, As substantially is not introduced from the second conducting film 32 into the semiconductor pillar 25 by thermal diffusion. Accordingly, in the case of such a configuration, a method may be used in which a potential is applied between the second conducting film 32 and the semiconductor pillar 25 to selectively destruct the portion of the second insulating film 22 opposing the second conducting film 32, and As is introduced into the semiconductor pillar 25 from the destructed portion.

As recited above, in the case where the first conductivity type is the p-type and the second conductivity type is the n-type, the diode D illustrated in FIG. 5 points in the reverse direction. Accordingly, the relationships of the potentials in the operations described in regard to FIG. 5 may be set to reversed values.

In addition to the materials recited above, any material may be used as the first impurity and the second impurity. For example, in the case of an n-type semiconductor, phosphorus (P) and antimony (Sb), for example, may be used as well as As. Also, in the case of a p-type semiconductor, indium (In), for example, may be used as well as B.

The difference in the permeability/blocking properties of the material used as the second insulating film 22 with respect to the first impurity and the second impurity may be utilized to selectively introduce one selected from the first impurity and the second impurity into the semiconductor pillar 25 by passing through the second insulating film 22 and to block the other by the second insulating film 22.

Thereby, the first region 41 and the second region 42 can be efficiently formed in the semiconductor pillar 25 with good controllability.

FIGS. 7A and 7B are schematic cross-sectional views in order of the processes, illustrating a method for manufacturing a nonvolatile semiconductor memory device according to the first embodiment of the invention.

Figure 8A:
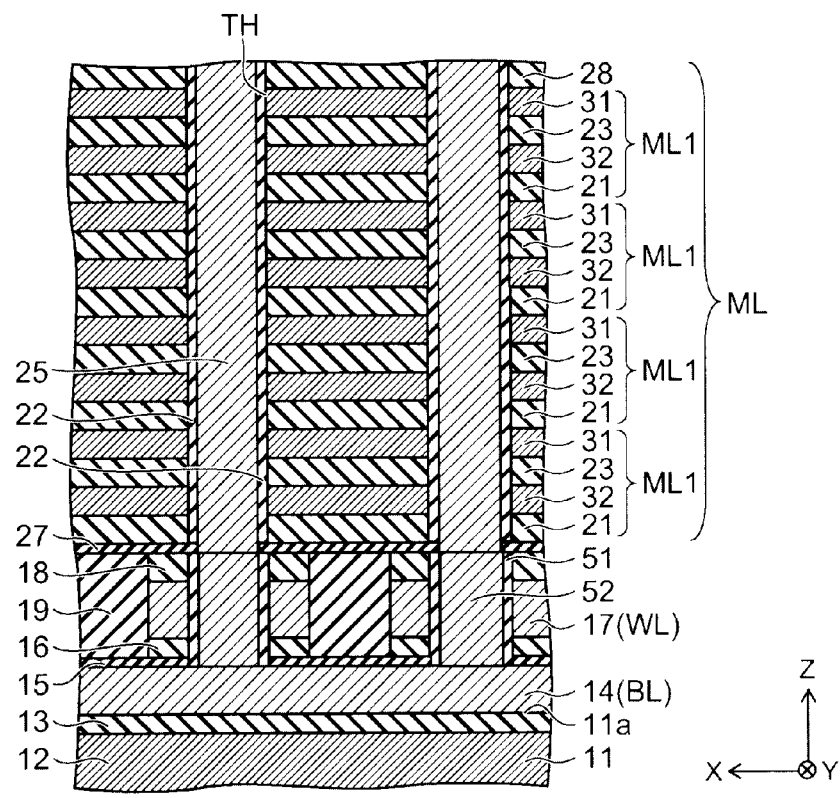
FIGS. 8A and 8B are schematic cross-sectional views in order of the processes, continuing from FIG. 7B.
Figure 8B:
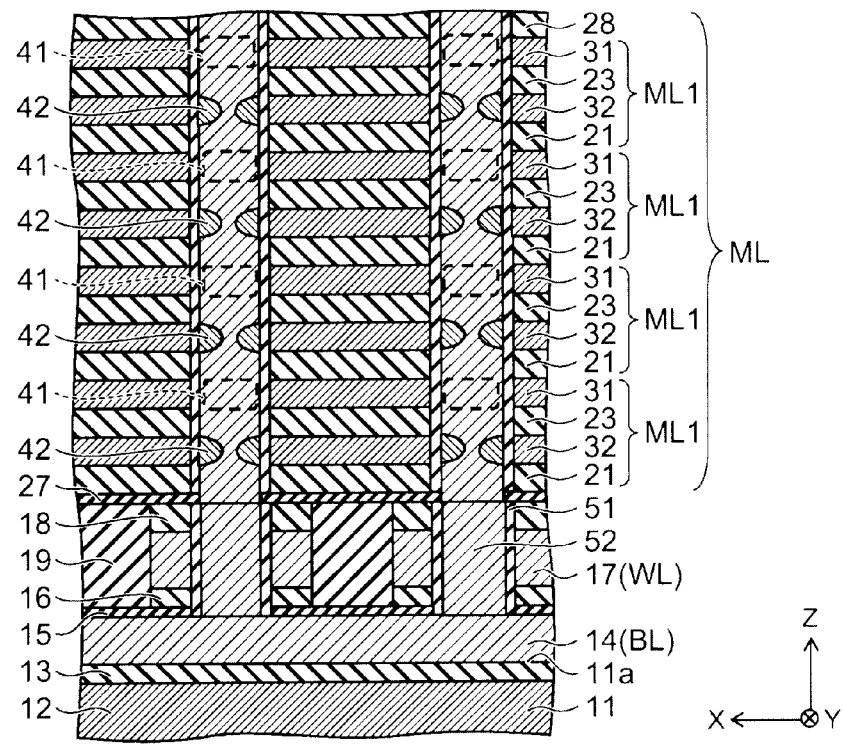

FIGS. 8A and 8B are schematic cross-sectional views in order of the processes, continuing from FIG. 7B.

These drawings are cross-sectional views corresponding to line A-A' of FIG. 3 and FIG. 4.

As illustrated in FIG. 7A, first, the drive circuit 12 is formed on a silicon substrate, i.e., the semiconductor substrate 11, to drive the memory cells MC. Thereupon, the inter-layer insulating film 13 is deposited and planarized. Thereupon, a conducting film forming the bit lines BL (the first interconnects 14) is formed, after which the conducting film is patterned into a band configuration aligned in the X-axis direction to form the bit lines BL.

Subsequently, an inter-layer insulating film 13a is filled between the bit lines BL. Then, the inter-layer insulating films 15 and 16, a conducting film forming the word lines WL (the second interconnects 17), and the inter-layer insulating film 18 are formed. Then, these films are patterned into a band configuration aligned in the Y-axis direction to form the word lines WL. The inter-layer insulating film 19 is filled into the space between the word lines WL and planarized.

A hole is made at the portion where the bit line BL and the word line WL intersect as viewed from the Z-axis direction to reach the bit line BL. The fifth insulating film 51 forming the gate insulating film is formed on the wall face of the inner side of the hole. After removing the fifth insulating film 51 from the bottom face of the hole, amorphous silicon, for example, is filled into the remaining space of the hole and planarized. Thus, the semiconductor layer 52 is formed in the interior of the insulating film on the inner side of the hole to form the selection gate transistor SG.

Continuing, the inter-layer insulating film 27 is formed thereupon. Subsequently, the stacked component units ML1 are multiply stacked, where one unit of the stacked component unit ML1 is, for example, a silicon oxide film forming the first insulating film 21, a polysilicon layer forming the second conducting film 32, a silicon oxide film forming the third insulating film 23, and a polysilicon layer forming the first conducting film 31. A silicon oxide film is further stacked as the inter-layer insulating film 28 on the uppermost stacked component unit ML1. Thereby, the stacked structural unit ML is formed.

In such a case, polysilicon doped with As is used as the first conducting film 31, and polysilicon doped with B is used as the second conducting film 32.

Although four layers of the stacked component units ML1 are formed in this specific example, the number of stacks is arbitrary. In other words, the number of polysilicon layers of the first conducting film 31 is determined according to the number of memory cells MC stacked in the Z-axis direction.

Then, as illustrated in FIG. 7B, a through-hole TH is made to pierce the stacked structural unit ML in the Z-axis direction by photolithography and etching. The through-hole TH is made in a matrix configuration to connect to the semiconductor layer 52 of the selection gate transistors SG formed at the intersection points between the word lines WL and the bit lines BL.

Then, a silicon oxide film forming the second insulating film 22 is formed on the wall face of the through-hole TH. Continuing, amorphous silicon forming the semiconductor pillar 25 is deposited into the remaining space of the through-hole TH. Subsequently, the upper face of the stacked structural unit ML is planarized.

Subsequently, the stacked component units ML1 are patterned into the configuration of the source lines SL. To pattern the source lines SL, patterning by RIE (Reactive Ion Etching) and slimming of the resist are repeated for one stacked component unit ML1 layer at a time such that the end portions of the source lines SL are formed into the stairstep configuration illustrated in FIG. 4. Such a structure is used as contact pads for subsequently connecting each layer of the first conducting films 31 to a contact via (the through-electrode SLa. Then, the through-electrode SLa, the interconnect SLb, and the through-electrode SLc are formed.

As illustrated in FIG. 8B, a heating process is performed, for example, at 1050° C. for 30 seconds such that B, i.e., the second impurity doped into the second conducting film 32, passes through the second insulating film 22, i.e., the silicon oxide film, diffuses into the semiconductor pillar 25, and locally forms the second region 42 including B in the semiconductor pillar 25. As described above, the As doped into the first conducting film 31 is blocked by the second insulating film 22, i.e., the silicon oxide film, and diffusion is suppressed. Therefore, As substantially does not enter into the semiconductor pillar 25.

Thereby, the region (the second region 42) where the p-type impurity B is doped into the semiconductor pillar 25 is alternately formed in the Z-axis direction with the undoped region (the first region 41).

In the manufacturing method recited above, the memory cells MC are formed by collectively making the through-holes TH. Therefore, the same number of lithography processes is used and cost increases can be held to a minimum even in the case where the number of layers of the memory cells MC is increased.

In the nonvolatile semiconductor memory device 110 thus constructed, the first region 41 is alternately formed in the Z-axis direction with the second region 42 in the semiconductor pillar 25. Thereby, a nonvolatile semiconductor memory device can be provided as a collectively patterned stacked OTP memory having stable operations in which interference between the source lines SL above and below is suppressed while using a PIN diode having a high ON/OFF ratio.

In this specific example, the second region 42 is provided to exist locally on the second insulating film 22 side of the portion of the semiconductor pillar 25 opposing the second conducting film 32. In other words, the second region 42 has a hollow annular configuration when cut in the X-Y plane. However, the invention is not limited thereto. The second region 42 may have any configuration.

Figure 9:
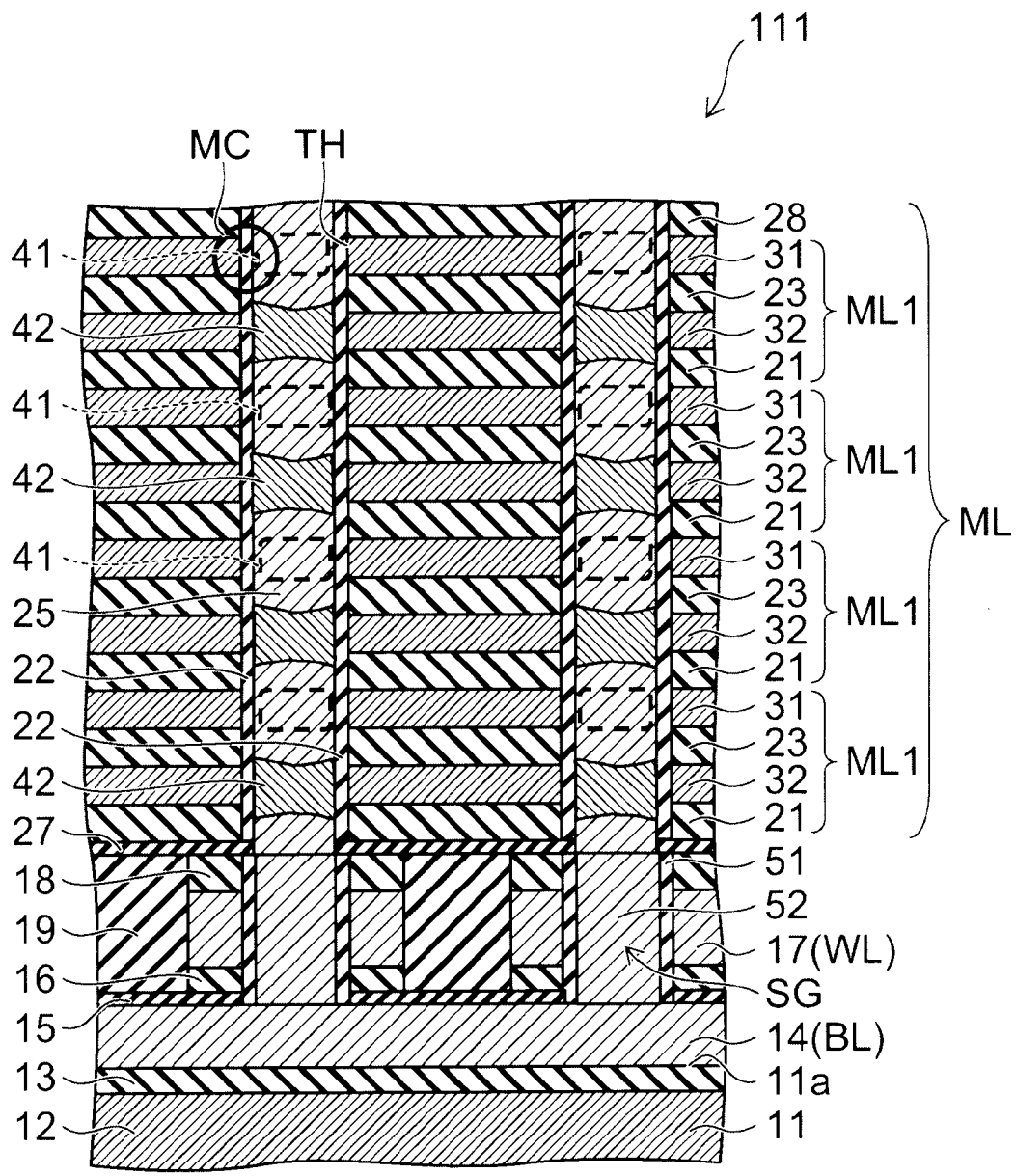
FIG. 9 is a schematic cross-sectional view illustrating the configuration of another nonvolatile semiconductor memory device according to the first embodiment of the invention.

FIG. 9 is a schematic cross-sectional view illustrating the configuration of another nonvolatile semiconductor memory device according to the first embodiment of the invention.

Namely, FIG. 9 is a cross-sectional view corresponding to the cross section along line A-A' of FIG. 3 and FIG. 4.

As illustrated in FIG. 9, in another nonvolatile semiconductor memory device 111 according to the first embodiment, the second region 42 has a non-hollow continuous discal configuration when cut in the X-Y plane. In such a case as well, the second region 42 is provided between the first regions 41 with respect to the Z-axis direction.

Figure 10:
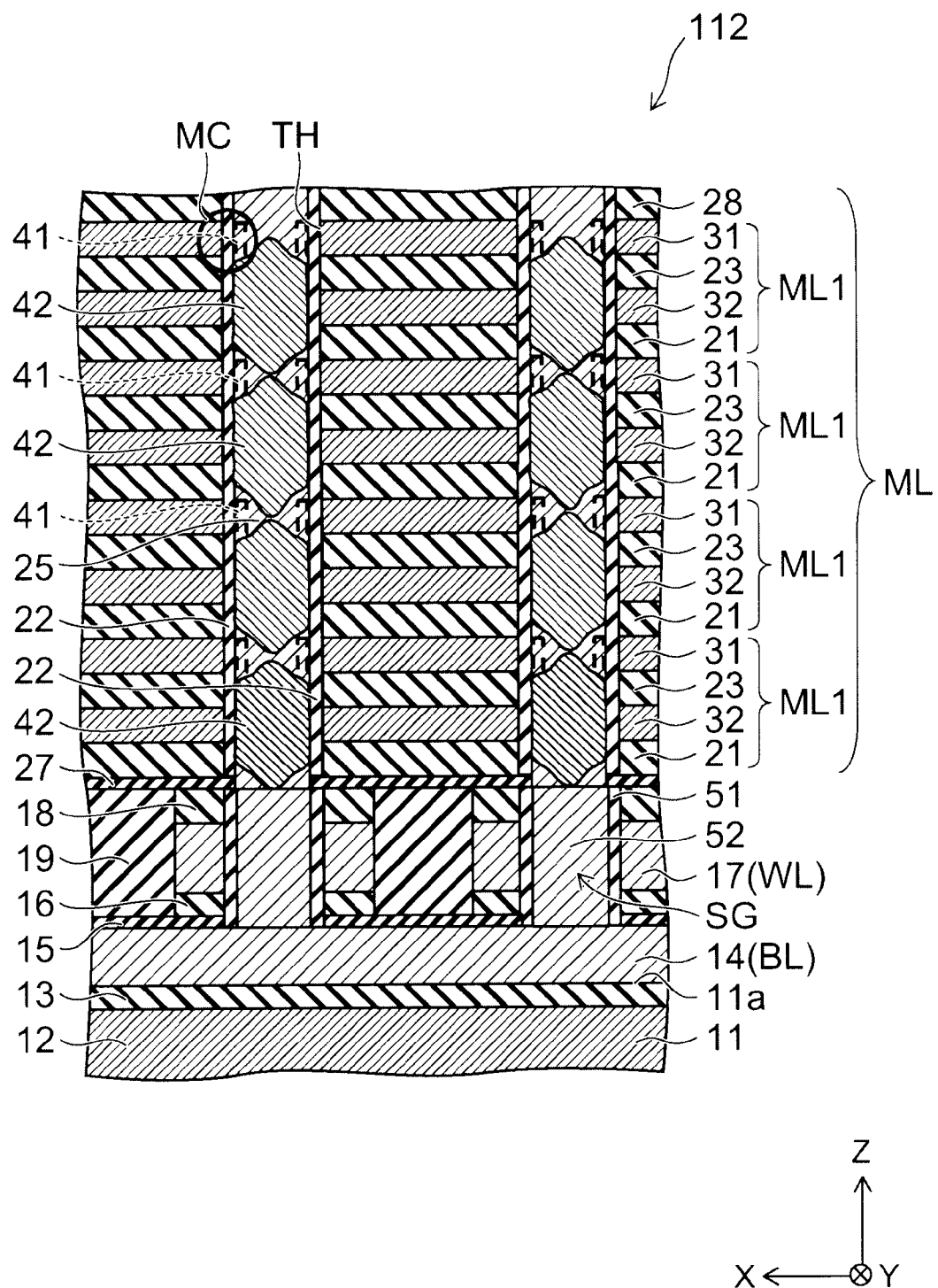
FIG. 10 is a schematic cross-sectional view illustrating the configuration of another nonvolatile semiconductor memory device according to the first embodiment of the invention.

FIG. 10 is a schematic cross-sectional view illustrating the configuration of another nonvolatile semiconductor memory device according to the first embodiment of the invention.

Namely, FIG. 10 is a cross-sectional view corresponding to the cross section along line A-A' of FIG. 3 and FIG. 4.

As illustrated in FIG. 10, in another nonvolatile semiconductor memory device 112 according to the first embodiment, the second region 42 is aligned from the region of the semiconductor pillar 25 opposing the second conducting film 32 toward the region opposing the first conducting film 31. The first region 41 is provided to exist locally on the second insulating film 22 side of the portion of the semiconductor pillar 25 opposing the first conducting film 31. In other words, the first region 41 has a hollow annular configuration when cut in the X-Y plane.

In such a case as well, an $n^+/i/p^-$ PIN diode is formed of the first conducting film 31, the first region 41 of the semiconductor pillar 25, and the second region 42 of the semiconductor pillar 25.

The nonvolatile semiconductor memory devices 111 and 112 having such configurations also can be provided as collectively patterned stacked OTP memories having stable operations in which interference between the source lines SL above and below is suppressed while using a PIN diode having a high ON/OFF ratio.

Thus, the first region 41 and the second region 42 may have any configurations as long as the first region 41 (in this case, an intrinsic semiconductor) of the semiconductor pillar 25 opposing each of the first conducting films 31 is alternately provided in the Z-axis direction with the second region 42 (in this case, a $p^-$ semiconductor) having a resistance different from that of the first region 41.

In this specific example, the first conducting film 31 is connected to the drive circuit 12 because the first conducting film 31 functions as the source line SL. On the other hand, the second conducting film 32 is provided to form the second region 42 in the semiconductor pillar 25 and therefore may be set to any potential or may have a floating potential.

Although this embodiment is an example in which the second region 42 is, for example, a $p^-$-Si film formed based on the second conducting film 32 (e.g., a $p^+$-Si film) interposed between each of the first conducting films 31 (e.g., $n^+$-Si films), in a second embodiment described below, a depletion layer formed in the semiconductor pillar 25 is used as the second region 42.

Second Embodiment

Figure 11:
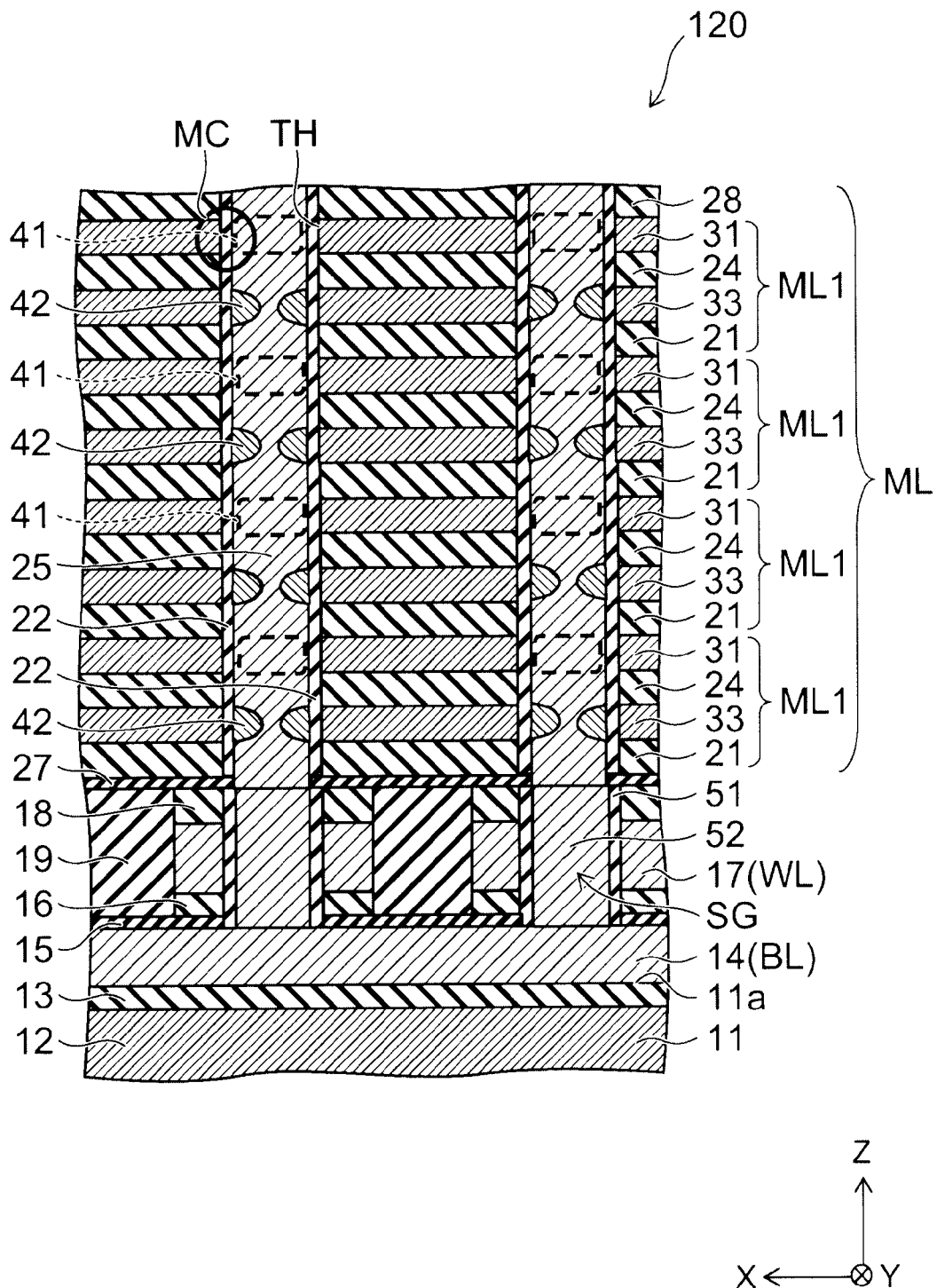
FIG. 11 is a schematic cross-sectional view illustrating the configuration of a nonvolatile semiconductor memory device according to a second embodiment of the invention.

FIG. 11 is a schematic cross-sectional view illustrating the configuration of a nonvolatile semiconductor memory device according to a second embodiment of the invention.

Figure 12:
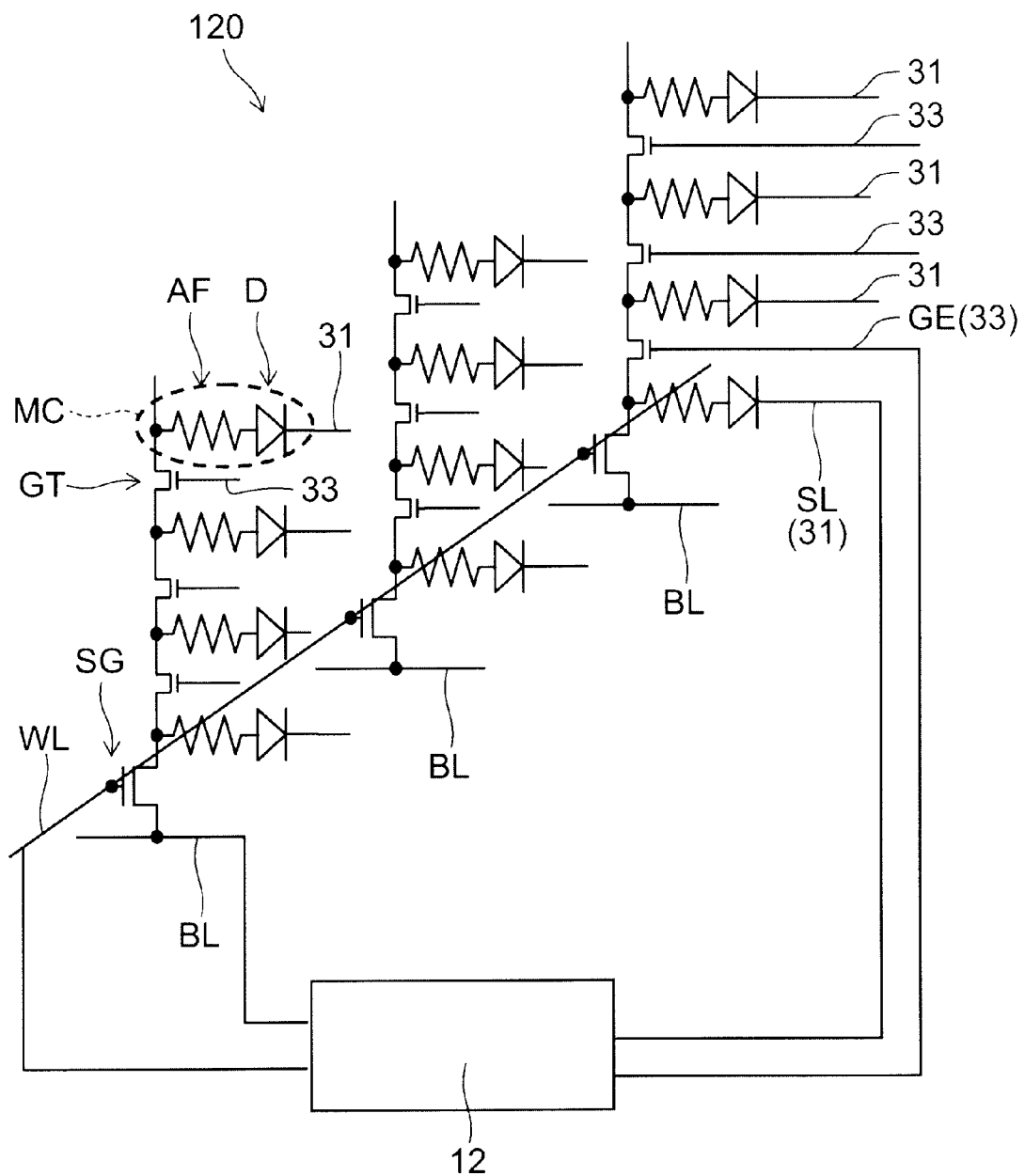
FIG. 12 is a schematic view illustrating operations of the nonvolatile semiconductor memory device according to the second embodiment of the invention.

FIG. 12 is a schematic view illustrating the operations of the nonvolatile semiconductor memory device according to the second embodiment of the invention.

FIG. 11 is a cross-sectional view corresponding to the cross section along line A-A' of FIG. 3 and FIG. 4. In other words, the planar structure of a nonvolatile semiconductor memory device 120 according to the second embodiment may be similar to the nonvolatile semiconductor memory device 110. The portions of the nonvolatile semiconductor memory device 120 differing from those of the nonvolatile semiconductor memory device 110 will now be described.

In the nonvolatile semiconductor memory device 120 as illustrated in FIG. 11, each of the stacked component units ML1 further include a third conducting film 33 provided between the first conducting film 31 and the first insulating film 21 and a fourth insulating film 24 provided between the third conducting film 33 and the first conducting film 31.

In the stacked component unit ML1 as well, the vertical relationship of the first conducting film 31 and the first insulating film 21 in the Z-axis direction is arbitrary. Further, the vertical relationship of the first conducting film 31 and the third conducting film 33 in the Z-axis direction is arbitrary. In other words, in the stacked component units ML1 stacked in the stacked structural unit ML, the third conducting film 33 is disposed between each pair of the first conducting films 31, and the first insulating film 21 or the fourth insulating film 24 is disposed between the third conducting film 33 and one of the first conducting films 31.

The second insulating film 22 is aligned not only between the first conducting film 31 and the semiconductor pillar 25 but also between the third conducting film 33 and the semiconductor pillar 25.

The first conducting film 31 is a semiconductor of the first conductivity type. For example, $n^+$ polysilicon may be used. The entire semiconductor pillar 25 is a conducting region of the second conductivity type. In other words, the semiconductor pillar 25 has the second conductivity type. For example, $p^-$ polysilicon may be used.

In other words, the first conducting film 31 may include the first impurity with the third concentration C3; the semiconductor pillar 25 may include the second impurity with a fifth concentration C5; and the fifth concentration C5 may be set lower than the third concentration C3.

Any conducting material may be used as the third conducting film 33. For example, at least one selected from a semiconductor material of the first conductivity type (e.g., the n-type), a semiconductor material of the second conductivity type (e.g., the p-type), and a metal material including alloys may be used.

Any insulating material may be used as the first insulating film 21, the second insulating film 22, and the fourth insulating film 24. For example, a silicon oxide film may be used.

The nonvolatile semiconductor memory device 120 further includes the drive circuit 12 to apply a potential to the first conducting film 31 and the semiconductor pillar 25. The drive circuit 12 also applies a potential to the third conducting film 33. In other words, the drive circuit 12 is electrically connected to the third conducting film 33.

A depletion layer formed in the semiconductor pillar 25 by the potential applied to the third conducting film 33 may be used as the second region 42.

The nonvolatile semiconductor memory device 120 also includes the semiconductor layer 52 electrically connected to the semiconductor pillar 25, the bit line BL (the first interconnect 14) provided to oppose the semiconductor layer 52 and align in the X-axis direction, the word line WL (the second interconnect 17) aligned in the Y-axis direction, and the gate insulating film (the fifth insulating film 51) provided between the semiconductor layer 52 and the word line WL. Thereby, the semiconductor pillar 25 may be controlled to be selected or unselected. The depletion layer is selectively formed in the selected or unselected semiconductor pillar 25.

In other words, as illustrated in FIG. 12, in this specific example, the third conducting film 33 is interposed between each of the first conducting films 31 functioning as the source lines SL. The third conducting film 33 functions as a gate electrode GE of a transistor (a gate transistor GT) provided in the semiconductor pillar 25 between the first conducting films 31 and having the semiconductor pillar 25 as a channel and the second insulating film 22 as a gate insulating film.

In other words, the gate transistor GT having the third conducting film 33 as the gate electrode GE is formed between each of the memory cells MC formed in the semiconductor pillar 25.

A prescribed potential is applied to the third conducting film 33. Thereby, a depletion layer is formed in the semiconductor pillar 25 opposing the third conducting film 33, and the depletion layer forms the second region 42. The portion of the semiconductor pillar 25 opposing the first conducting film 31 forms the first region 41. The first region 41 and the second region 42 are alternately arranged with each other in the Z-axis direction. The resistance of the second region 42 is higher than that of the first region 41.

In this specific example, the $n^+$-Si film of the first conductivity type (an n-type semiconductor) is used as the first conducting film 31, and the $p^-$-Si film of the second conductivity type (a p-type semiconductor) is used as the semiconductor pillar 25. For example, when reading, the potential of the third conducting film 33 is set near 0 V, and the selected semiconductor pillar 25 is biased with a positive potential. Thereby, holes are stored in the portion of the semiconductor pillar 25 opposing the gate electrode GE (the third conducting film 33).

On the other hand, the potential of the unselected semiconductor pillars 25 is set near 0 V. Therefore, the portions of the semiconductor pillars 25 opposing the gate electrodes GE (the third conducting films 33) of the unselected semiconductor pillars 25 are in a depleted state. The regions in the depleted state form the second regions 42. By such second regions 42, the leak current is reduced between the first conducting films 31 of layers above and below for unselected semiconductor pillars 25.

Thus, the nonvolatile semiconductor memory device 120 can be provided as a collectively patterned stacked OTP memory having stable operations by using a diode with a high ON/OFF ratio.

Third Embodiment

A third embodiment of the invention relates to a method for manufacturing a nonvolatile semiconductor memory device. This method manufactures a nonvolatile semiconductor memory device having a structure in which the first conducting film 31 of the first conductivity type is alternately stacked with the second conducting film 32 of the second conductivity type as the nonvolatile semiconductor memory devices 110, 111, and 112 according to the first embodiment.

Figure 13:
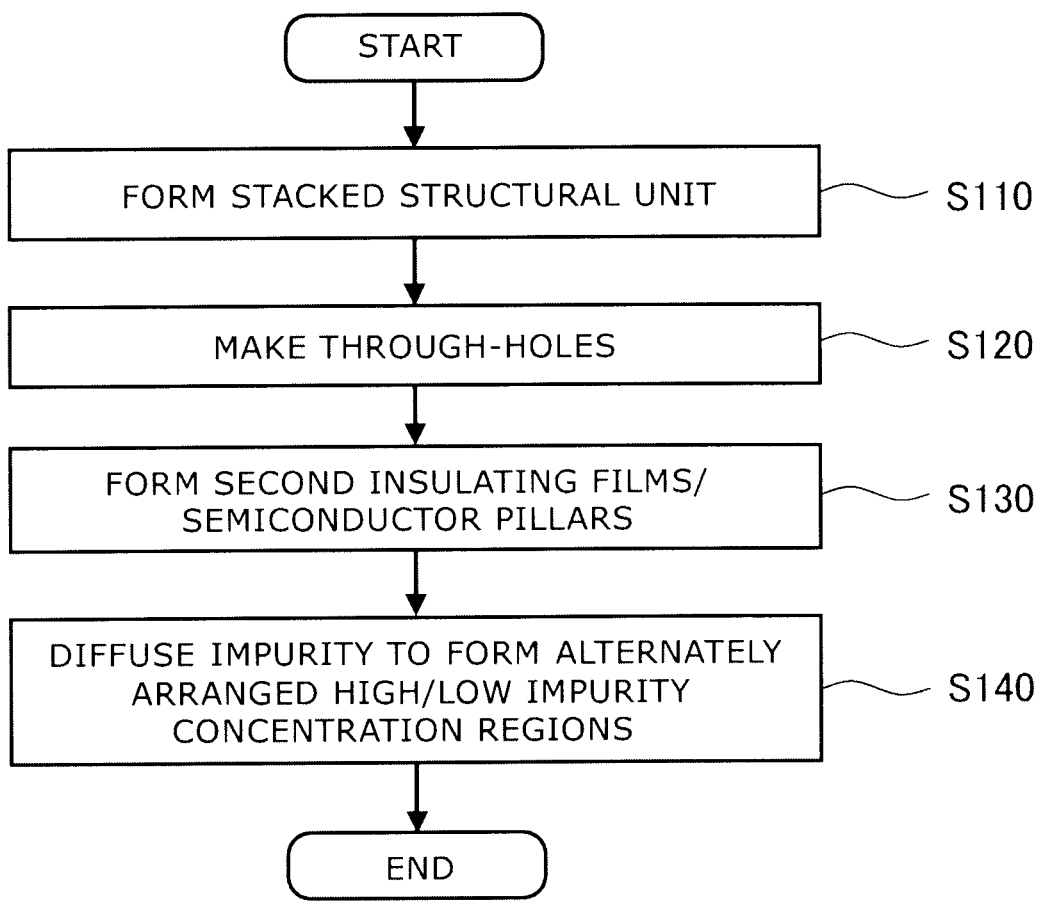
FIG. 13 is a flowchart illustrating a method for manufacturing a nonvolatile semiconductor memory device according to a third embodiment of the invention.

FIG. 13 is a flowchart illustrating the method for manufacturing the nonvolatile semiconductor memory device according to the third embodiment of the invention.

In the method for manufacturing the nonvolatile semiconductor memory device according to the third embodiment of the invention as illustrated in FIG. 13, first, a first process is implemented to form the stacked structural unit ML on the major surface 11a of a substrate (e.g., the semiconductor substrate 11). The stacked structural unit ML includes multiple stacked layers of the stacked component units ML1. The stacked component unit ML1 includes the first conducting film 31 made of a semiconductor of the first conductivity type, the first insulating film 21, the second conducting film 32 made of a semiconductor of the second conductivity type, and the third insulating film 23. The forming of the stacked structural unit ML includes multiply repeating a forming of the stacked component unit ML1 on the major surface 11a of the substrate. The forming of the stacked component unit ML1 includes stacking the first conducting film 31, stacking the first insulating film 21, stacking the second conducting film 32 between the stacking of the first conducting film 31 and the stacking of the first insulating film 21, and stacking the third insulating film 23 between the stacking of the second conducting film 32 and the stacking of the first conducting film 31 (step S110).

For example, the method described in regard to FIG. 7A may be used. For example, polysilicon including arsenic (As) may be used as the first conducting film 31, and polysilicon including boron (B) may be used as the second conducting film 32.

Then, a second process is implemented to make the through-holes TH to pierce the stacked structural unit ML in the first direction (the Z-axis direction) perpendicular to the major surface 11a (step S120).

For example, the method described in regard to FIG. 7B may be used.

Then, a third process is implemented to form the second insulating film 22 on the inner walls of the through-holes TH and fill a semiconductor material into the remaining space on the inner side of the through-holes TH to form the semiconductor pillars 25 (step S130).

For example, the method described in regard to FIG. 8A may be used. For example, an intrinsic semiconductor including substantially no impurities may be filled into the through-holes TH.

Then, a fourth process is implemented to diffuse the impurity (e.g., B) included in the second conducting film 32 into the semiconductor pillar 25 to form a periodic structure of a region of the semiconductor pillar 25 (the second region 42) having a high impurity concentration alternately arranged in the Z-axis direction with a region (the first region 41) having a low impurity concentration (step S140).

For example, the method described in regard to FIG. 8B may be used.

Thereby, for example, the first region 41, i.e., the intrinsic semiconductor, can be arranged in the semiconductor pillar 25 alternately with respect to the Z axis with the second region 42 including B with a low concentration; and any of the nonvolatile semiconductor memory devices 110, 111, and 112 according to the first embodiment can be constructed.

Thereby, a manufacturing method is provided for a nonvolatile semiconductor memory device as a collectively patterned stacked OTP memory having stable operations by using a diode with a high ON/OFF ratio.

Thus, in the method for manufacturing the nonvolatile semiconductor memory device according to this embodiment, the first conducting film 31 includes As, the second conducting film 32 includes B, and the fourth process (step S140) includes diffusing the B included in the second conducting film 32 into the semiconductor pillar 25 via the second insulating film 22.

In such a case, the fourth process (step S140) may use at least one selected from diffusing the impurity included in the second conducting film 32 via the second insulating film 22 by heating and diffusing the impurity included in the second conducting film 32 via a destructed portion selectively made in the second insulating film 22. Thereby, the impurity of the second conducting film 32 can be introduced into the semiconductor pillar 25 with good controllability.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the invention is not limited to these specific examples. For example, one skilled in the art may appropriately select specific configurations of components of nonvolatile semiconductor memory devices such as semiconductor substrates, electrode films, insulating films, stacked component units, stacked structural units, through-holes, semiconductor pillars, word lines, bit lines, source lines, insulating films, and insulating layers from known art and similarly practice the invention. Such practice is included in the scope of the invention to the extent that similar effects thereto are obtained.

Further, any two or more components of the specific examples may be combined within the extent of technical feasibility; and are included in the scope of the invention to the extent that the purport of the invention is included.

Moreover, all nonvolatile semiconductor memory devices and methods for manufacturing nonvolatile semiconductor memory devices practicable by an appropriate design modification by one skilled in the art based on the nonvolatile semiconductor memory devices and the methods for manufacturing nonvolatile semiconductor memory devices described above as exemplary embodiments of the invention also are within the scope of the invention to the extent that the purport of the invention is included.

Furthermore, various modifications and alterations within the spirit of the invention will be readily apparent to those skilled in the art. All such modifications and alterations should therefore be seen as within the scope of the invention. For example, additions, deletions, or design modifications of components or additions, omissions, or condition modifications of processes appropriately made by one skilled in the art in regard to the embodiments described above are within the scope of the invention to the extent that the purport of the invention is included.

The invention claimed is:

1. A nonvolatile semiconductor memory device, comprising:
    a stacked structural unit including a plurality of stacked component units stacked in a first direction, each of the stacked component units including a first conducting film and a first insulating film stacked with the first conducting film in the first direction, the first conducting film being provided in a plane perpendicular to the first direction and made of a semiconductor of a first conductivity type;
    a semiconductor pillar piercing the stacked structural unit in the first direction and including a conducting region of a second conductivity type, the semiconductor pillar including
        first regions, each of the first regions being provided in the plane with each of the first conducting films, the first regions being apart from each other in the first direction, and
        a second region provided between the first regions with respect to the first direction, the second region having a resistance different from a resistance of each of the first regions; and
    memory portions including a second insulating film, each of the memory portions being provided between each of the first regions and the first conducting film, the second insulating film being provided between the semiconductor pillar and the first conducting film.

2. The device according to claim 1, wherein
the conducting region is the second region, and the resistance of the second region is lower than the resistance of the first regions.

3. The device according to claim 2, wherein a concentration of an impurity included in the first regions is lower than a concentration of an impurity included in the second region.

4. The device according to claim 3, wherein the first conducting film includes a first impurity, and
    a concentration of the impurity included in the second region is lower than a concentration of the first impurity included in the first conducting film.

5. The device according to claim 1, wherein:
the first conducting film includes a first impurity;
each of the stacked component units further includes:
    a second conducting film provided between the first conducting film and the first insulating film, the second conducting film including a second impurity and being made of a semiconductor of the second conductivity type; and
    a third insulating film provided between the second conducting film and the first conducting film;
    the conducting region is the second region; and
    the second region includes the second impurity with a concentration lower than a concentration of the second impurity included in the second conducting film.

6. The device according to claim 5, wherein the concentration of the second impurity of the second region is lower than a concentration of the first impurity included in the first conducting film.

7. The device according to claim 5, wherein the concentration of the second impurity of the second region is lower than a concentration of the first impurity included in the first conducting film and a concentration of an impurity included in the first regions is lower than the concentration of the second impurity included in the second region.

8. The device according to claim 1, wherein the first regions include an intrinsic semiconductor.

9. The device according to claim 5, wherein the second insulating film extends in a region between the semiconductor pillar and the second conducting film.

10. The device according to claim 9, wherein the second insulating film extends in a region between the semiconductor pillar and the first insulating film and extends in a region between the semiconductor pillar and the third insulating film.

11. The device according to claim 5, wherein the second region includes the second impurity diffused from the second conducting film.

12. The device according to claim 5, wherein the second region includes the second impurity diffused from the second conducting film into the semiconductor pillar via a destructed portion selectively made in the second insulating film.

13. The device according to claim 5, wherein the first impurity is arsenic, the second impurity is boron, and the second region includes the second impurity diffused from the second conducting film into the semiconductor pillar via the second insulating film.

14. The device according to claim 5, wherein a permeability of the second insulating film with respect to the second impurity is lower than a permeability of the second insulating film with respect to the first impurity.

15. The device according to claim 1, further comprising a drive circuit,
    each of the stacked component units further including
    a third conducting film provided between the first conducting film and the first insulating film, and
    a fourth insulating film provided between the third conducting film and the first conducting film,
    the second insulating film extending in a region between the third conducting film and the semiconductor pillar,
    an entirety of the semiconductor pillar being the conducting region,
    the drive circuit applying a potential to the third conducting film, and
    the second region being a depletion layer formed in the semiconductor pillar by the potential applied to the third conducting film.

16. The device according to claim 15, wherein the first conducting film includes a first impurity, the semiconductor pillar includes a second impurity, and a concentration of the second impurity included in the semiconductor pillar is lower than a concentration of the first impurity included in the first conducting film.

17. The device according to claim 15, wherein the third conducting film is provided between the first conducting films and is a gate electrode of a transistor having the semiconductor pillar as a channel and the second insulating film as a gate insulating film.

18. The device according to claim 1, further comprising:
- a semiconductor layer electrically connected to the semiconductor pillar;
- a first interconnect provided to oppose the semiconductor layer, the first interconnect being aligned in a second direction perpendicular to the first direction;
- a second interconnect aligned in a third direction perpendicular to the first direction and non-parallel to the second direction; and
- a fifth insulating film provided between the semiconductor layer and the second interconnect.

* * * * *